(12) United States Patent
Nistler et al.

(10) Patent No.: US 7,791,344 B2
(45) Date of Patent: Sep. 7, 2010

(54) MAGNETIC RESONANCE RF TRANSMISSION SYSTEM AND MR SYSTEM AND METHOD USING SAME

(75) Inventors: Juergen Nistler, Erlangen (DE); Wolfgang Renz, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 117 days.

(21) Appl. No.: 12/238,848

(22) Filed: Sep. 26, 2008

(65) Prior Publication Data
US 2009/0079428 A1    Mar. 26, 2009

(30) Foreign Application Priority Data
Sep. 26, 2007    (DE) .................. 10 2007 046 082

(51) Int. Cl.
*G01V 3/00* (2006.01)
(52) U.S. Cl. ...................... 324/322; 324/318
(58) Field of Classification Search ............ 324/322, 324/318
See application file for complete search history.

(56) References Cited

U.S. PATENT DOCUMENTS

| | | | |
|---|---|---|---|
| 4,638,253 A | 1/1987 | Jaskolski et al. | |
| 5,473,252 A | 12/1995 | Renz et al. | |
| 6,552,538 B2 * | 4/2003 | DeMeester et al. | 324/307 |
| 6,876,197 B2 * | 4/2005 | Albrecht et al. | 324/307 |
| 7,119,543 B2 * | 10/2006 | Albrecht et al. | 324/322 |
| 7,135,864 B1 * | 11/2006 | McKinnon et al. | 324/318 |

* cited by examiner

*Primary Examiner*—Louis M Arana
(74) *Attorney, Agent, or Firm*—Schiff Hardin LLP

(57) ABSTRACT

A radio-frequency transmission system for a magnetic resonance system has a radio-frequency amplifier and a signal splitter with two inputs and two outputs. The signal splitter is fashioned so that the power of a radio-frequency signal provided at one of the two inputs is divided between the two outputs. A first input the two inputs of the signal splitter is thereby coupled with the output of the radio-frequency amplifier, and the two outputs of the signal splitter respectively serve for connection to different inputs of a transmission antenna of the magnetic resonance system in order to feed the output signals present at the two outputs of the signal splitter into the transmission antenna. The second input of the signal splitter is terminated with a terminating resistor arrangement with a variable reflection factor.

14 Claims, 3 Drawing Sheets

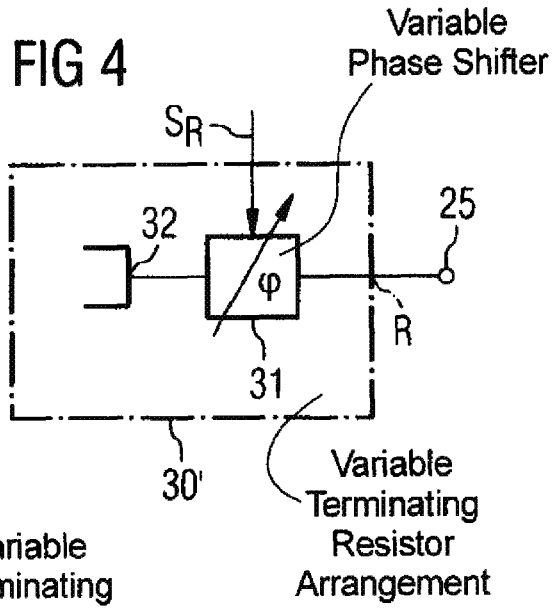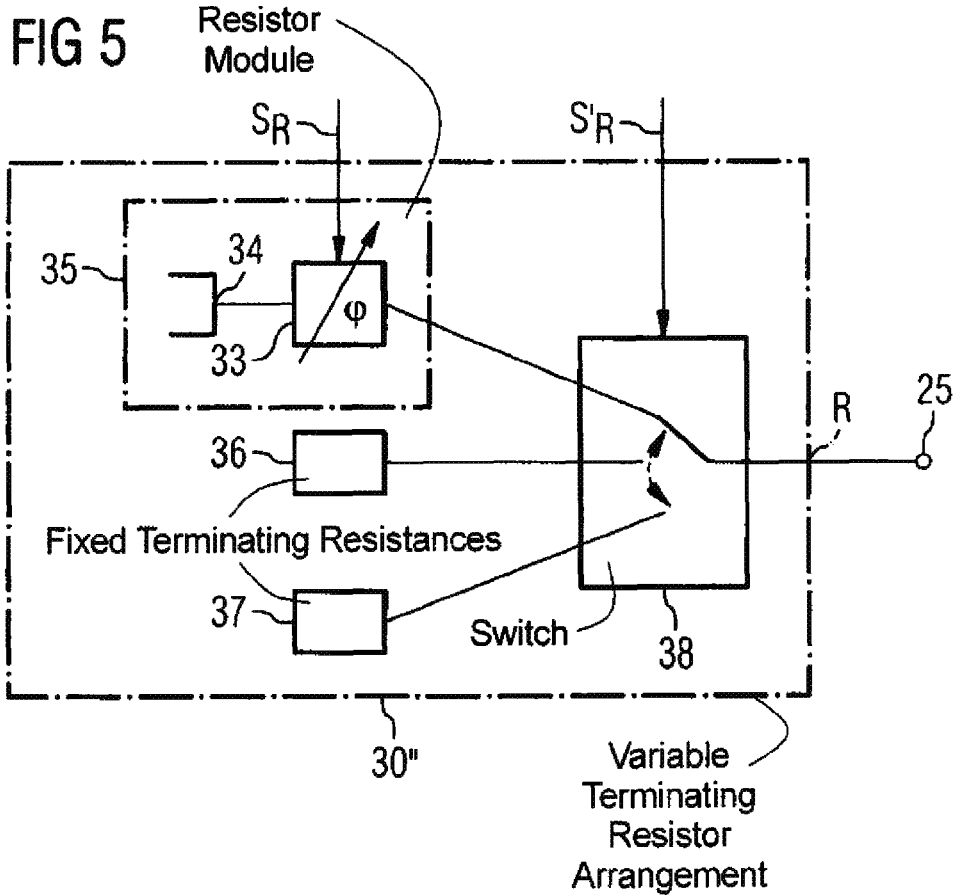

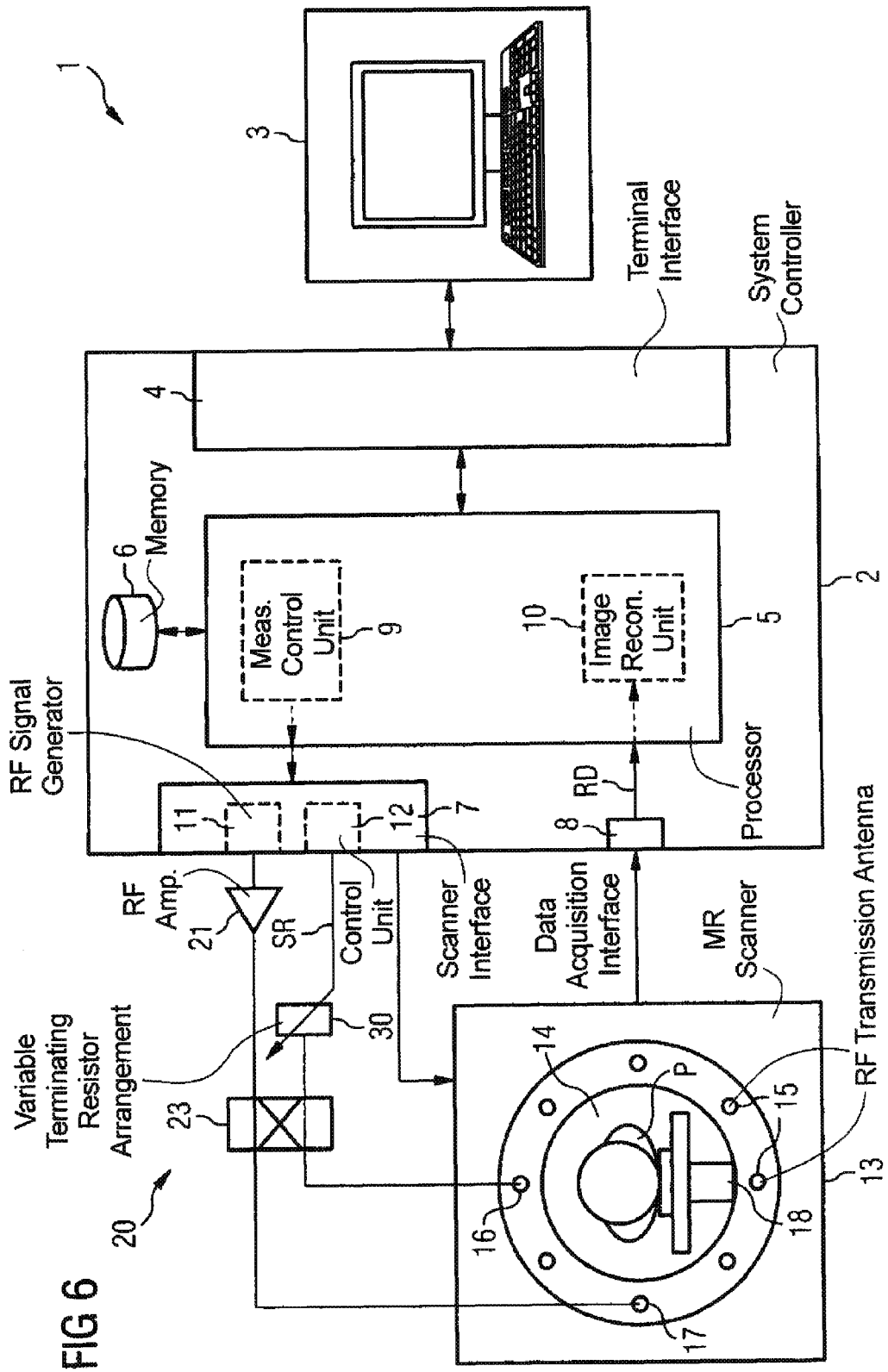

MAGNETIC RESONANCE RF TRANSMISSION SYSTEM AND MR SYSTEM AND METHOD USING SAME

BACKGROUND OF THE INVENTION

1. Field of the Invention

The present invention concerns a radio-frequency transmission system for a magnetic resonance system, of the type having a radio-frequency amplifier and a signal splitter with two inputs and two outputs, wherein the power of a radio-frequency signal provided at any one of the two inputs is divided between the two outputs. A first input of the two inputs of the signal splitter is thereby coupled with the output of the radio-frequency amplifier, and the two outputs of the signal splitter respectively serve to connect to different inputs of a transmission antenna of the magnetic resonance system in order to feed the output signals present at the two outputs of the signal splitter into the transmission antenna in operation. Moreover, the invention concerns a magnetic resonance system with a transmission antenna that has at least two inputs to feed in radio-frequency signals, and with such a radio-frequency transmission system. Furthermore, the invention concerns a method to control a magnetic resonance system to acquire magnetic resonance image data of an examination subject, in which method, to generate a radio-frequency field in an examination volume, radio-frequency signals emitted with a specific signal power by a radio-frequency amplifier are directed to an input of a signal splitter in which the power of the radio-frequency signal is divided into two output signals present at two outputs of the signal splitter, these output signals being respectively fed into different inputs of a transmission antenna.

2. Description of the Prior Art

Magnetic resonance tomography is a widespread technique to acquire images of the inside of the body of a living examination subject. In order to acquire an image with this method, the body or a body part of the patient or test subject to be examined must initially be exposed to an optimally homogeneous, static basic magnetic field, which is generated by a basic magnetic field of the magnetic resonance system. During the acquisition of the magnetic resonance images, rapidly switched gradient fields (generated by gradient coils) are superimposed on this basic magnetic field for spatial coding. Moreover, radio-frequency pulses of a defined field strength (known as the "B1 field") are radiated into the examination subject with radio-frequency antennas. By means of these radio-frequency pulses, the atoms in the examination subject are excited such that they are deflected from their equilibrium state parallel to the basic magnetic field by what is known as an "excitation flip angle". The nuclear spins then precess around the direction of the basic magnetic field. The magnetic resonance signals thereby generated are acquired by radio-frequency acquisition antennas. Magnetic resonance images of the examination subject are generated on the basis of the acquired magnetic resonance signals.

To radiate the required radio-frequency pulses into the patient positioning region of the apparatus, the magnetic resonance system typically has an antenna structure permanently installed in the housing of a scanner. This radio-frequency tranmission antenna is also designated as a body coil. For example, the frequently used birdcage structure is formed by a number of conductor rods arranged around the patient space and running parallel to the basic field direction, these conductor rods being connected with one another via annular conductors at the front side of the coil. As an alternative, there are also other antenna structures permanently installed in the housing, for example saddle coils. Moreover, local coils can also be used that are arranged directly on the body of the patient. These local coils have conventionally been used only as acquisition coils. Classical magnetic resonance systems have essentially only one transmission channel to emit the B1 field, meaning that there exists only one transmission line that leads from the radio-frequency amplifier to the transmission antenna. Insofar as the antenna (for example a birdcage antenna) is fashioned such that a circular polarized field can be emitted, the radio-frequency signal coming from the radio-frequency amplifier can initially be divided into two signals via a signal splitter. A component known as a hybrid module is typically used for this purpose. The signal splitter is therefore also designated in the following as a "hybrid" for short. The output signals have a phase difference that is primarily predetermined by the signal splitter that is employed. Often a hybrid known as a $\pi/2$ hybrid is used in which the output signals are shifted opposite one another by 90° in terms of their phase. The two signals are then fed into the antenna structure via two signal lines to precisely defined connection points, or inputs.

Such a classical design is schematically presented in FIG. 1. Starting from a radio-frequency signal generator 11, the radio-frequency signals are amplified in the radio-frequency amplifier 21 so that they possess a sufficient transmission power. The distribution of the transmission power to two transmission channels at the two outputs 26, 27 of the hybrid 23 ensues in the hybrid 23. The two signal portions are relayed to two inputs 16, 17 of the transmission antenna 15 and fed in there. The employed hybrid 23 is normally a 4-gate hybrid with an additional input 25. This is typically terminated with a termination resistor 28, typically 50 Ω, which serves as a "sump" for transmission power reflected back from the antenna 15 or returning due to overcouplings between the antenna inputs 16, 17. The precise conductor and reflection behavior of such a design is discussed in more detail below.

In this design, the distribution of the B1 field is frozen or fixed via the distribution to the two transmission channels with the phases of 0° and 90° and cannot be adapted to the current conditions of the pending measurement.

Particularly in newer magnetic resonance systems with basic magnetic field strengths greater than three Tesla, considerable eddy currents are frequently induced in the patient upon radiation of the radio-frequency pulses. As a result, the actual homogeneous radiated B1 field is more or less strongly distorted in the examination volume. The influence of the patient body on the B1 field is thereby strongly dependent on the body stature of the patient and the proportions of the individual tissue types, among other things. For example, a very corpulent patient causes a circularly polarized magnetic field to be severely distorted into an elliptical field. This distortion is not as severe for thinner patients. In individual cases this can lead to the situation that a magnetic resonance measurement is unreliable in specific body regions of the patient and delivers unusable results.

In order to be able to suitably influence the structure of the radiated magnetic field in an optimally detailed manner in all regions of the examination volume, and in particular in order to achieve an optimally good homogeneity of the B1 field in an examination volume via a compensation of the possible distortions, local field corrections have conventionally been implemented by the use of dielectric cushions (pillows), for example.

Presently, individual adjustments of the amplitude and phase values of the radio-frequency pulses emitted from each transmission channel are being investigated as an additional approach to homogenization of the B1 field. The spatial distribution of the B1 field can be influenced thereby, with the goal of generating an optimally homogeneous radio-frequency field in the examination subject or in the examination volume while taking into account the field distortions to be expected. One development of this approach is the use of multiple, separately controllable antenna elements. An example of this is explained in DE 101 24 465 A 1, which describes an antenna with a number of separately controllable antenna elements. This means that every transmission channel has a separate antenna element. Alternatively, different feed lines connected to a common antenna structure can be supplied via individually controllable transmission channels.

A particularly simple variant of this is shown in FIG. 2. FIG. 2 shows a typical 2-port antenna as is also used in the design according to FIG. 1. As before, a radio-frequency signal generated by a radio-frequency signal generator 11 is likewise amplified in a radio-frequency power amplifier 21 and divided via a hybrid 23 between the two antenna inputs 16, 17. However, a difference from the design according to FIG. 1 is that the output of a second radio-frequency power amplifier 21' is connected to the second input 25 of the 4-gate hybrid 23. A second, independent radio-frequency signal generator to supply the second radio-frequency power amplifier 21 can also likewise be used. Given this design, an arbitrary weighting of the signals fed into the transmission antenna 14 at the two inputs 16, 17 is possible in that a different amplification ensues via the two radio-frequency amplifiers 21, 21'. For example, as before the first amplifier 21 can deliver the majority of the transmission power. Only an additional portion in order to adjust the field distribution as desired, and in particular to improve the field homogeneity at least in the region of interest of the patient, then comes from the second amplifier 21'. However, a second radio-frequency amplifier is required for this design, which leads to significant additional costs.

SUMMARY OF THE INVENTION

It is an object of the present invention to provide a more cost-effective alternative to address the aforementioned problems.

As in conventional systems, a "normal" 4-gate signal splitter with two inputs and two outputs is used in a radio-frequency transmission system according to the invention, this signal splitter being fashioned so that the power of a radio-frequency signal coming from any one of the two inputs is divided between the two outputs. The division advantageously ensues symmetrically. As in the conventional design, an input of the signal splitter is likewise coupled with the output of the radio-frequency amplifier, and the two outputs of the signal splitter respectively serve for connection to the antenna inputs. The signal splitter thus can be fashioned (for example corresponding to the position of the antenna inputs of the structure of the transmission antenna) so that the output signals of the signal splitter are shifted corresponding to the antenna inputs by a defined phase relative to one another, for example by 90°.

According to the invention, however, the second input of the signal splitter is now terminated not just with a terminating resistor (for example of 50 Ω) which has an optimally low reflection factor in order to capture the power returning from the antenna. Instead of this—in contrast to the typical design—the second input of the signal splitter is terminated with a terminating resistor arrangement with a variable reflection factor.

In the method according to the invention, the reflection factor of the terminating resistor arrangement is set so that a signal portion emanating at the second input of the signal splitter due to the reflection at the antenna inputs is reflected back again to the inputs of the transmission antenna at least in significant part by the terminating resistor arrangement, such that the radio-frequency field radiated by the transmission antenna exhibits a predetermined field distribution. As used herein "a significant part" means a sufficient portion (and not just unintentional, slight signal portions) is deliberately reflected back in order to achieve a desired field distribution because (for example) an actual desired reflection factor of 0 cannot be ensured over the entire frequency range for technical reasons.

As described in more detail below, the adjustment of the terminating resistor to a specific reflection factor allows a definable signal portion, which is initially reflected at the antenna inputs, to be reflected back again to the antenna and to be superimposed with the signal portions of the original signal generated by the division of the signal splitter at the first input of the signal splitter. A relatively arbitrary field distribution (for example a specific mode) of the emitted radio-frequency field thus can be achieved within certain limits, similar to the result that was previously possible only by hard-wiring the second input of the hybrid with a second radio-frequency amplifier.

The homogeneity of the B1 field thus can be significantly improved in relation to the conventional solutions with only one radio-frequency amplifier. Only a very slight additional hardware expenditure is thereby necessary, namely for the design of a suitable terminating resistor arrangement. A second, relatively expensive amplifier is not needed. Existing magnetic resonance systems thus can be easily retrofitted since a magnetic resonance system according to the invention must have—in addition to a typical transmission antenna with at least two inputs to feed in the radio-frequency signals—only one radio-frequency transmission system according to the invention, this radio-frequency transmission system merely having the adjustable terminating resistor arrangement.

The above object also is achieved in accordance with the present invention by a magnetic resonance imaging system embodying a radio-frequency transmission system of the type described above, and all embodiments thereof.

The above object also is achieved in accordance with the present invention by a method for operating a magnetic resonance imaging system and/or a radio-frequency transmission system of the type described above by varying the reflection factor at one of the inputs of the signal splitter.

There are various possibilities for the adjustment of the terminating resistor to different reflection factors. In a preferred exemplary embodiment, the terminating resistor arrangement can have different terminating resistors and a change-over switch, for example a coaxial relay or the like. The second input of the signal splitter can be selectively connected with the various terminating resistors by the change-over switch. Any types of terminating resistors that exhibit different reflection factors can be used, for example a number of simple ohmic resistors or complex impedances constructed from inductors and/or capacitors.

An alternative to such a terminating resistor arrangement with a change-over switch is for the terminating resistor arrangement to contain a set of different terminating resistors which are respectively connected with a connection element of a first connection element type. The second input of the signal splitter should then be connected with a connection element of a second connection element type compatible with the first connection element type, such that the various terminating resistors of the set can selectively be connected by the operator to the second input of the signal splitter. Although such a terminating resistor arrangement is very cost-effective, it is significantly more cumbersome to operate, such that an adjustable or switchable terminating resistor arrangement is preferred.

In the adjustment of the terminating resistor or of the terminating resistor arrangement to achieve a specific reflection factor, it should be taken into consideration that the reflection factor also depends on the frequency of the respective radio-frequency signals. Insofar as a fixed frequency is used—as is typical at present—this is unproblematical since every available terminating resistor has a reflection factor designed with regard to this frequency. However, if as measurements with different frequencies are to be implemented to excite different metabolisms, a more flexible adjustment of the reflection factor is desirable.

It is particularly advantageous if the terminating resistor arrangement is fashioned such that the reflection factor of the terminating resistor arrangement can also be adjusted continuously (i.e. infinitely variably) at least within a specific adjustment range.

A particularly simple design of such an adjustable terminating resistor arrangement is to terminate the second input of the signal splitter (for example shorted) with an adjustable phase shifter. This means that the terminating resistor arrangement is formed from an adjustable phase shifter that is connected at the second input of the signal splitter and a short circuit connected at the other connection of the phase shifter.

Such a phase shifter can be a simple, adjustable delay element, for example a length-adjustable RF conductor. It is also possible to operate with change-over switches and conductors with defined, different lengths.

Moreover, a continuously variable terminating resistor arrangement can herewith be realized simply by marking the phase shifter continuously variable at least within a specific adjustment range, i.e. it can have a length-adjustable RF conductor, for example. Such conductors are commercially available.

The transmission antennas in magnetic resonance systems are typically tuned (matched) so that the reflection factors at both inputs are optimally small, i.e. near zero. However, in order to enhance operation according to the invention the transmission antenna could be fashioned such that the reflection factors deviate from zero by a specific minimum amount at the antenna inputs so that at least one predetermined minimum portion of the radio-frequency signal transmitted to the antenna is reflected at the antenna inputs. This means that a not necessarily much greater, but nevertheless more significant, portion of the signal power is reflected back to the hybrid. For example, the magnitude of the reflection factor at the antenna inputs can be at least 0.2. The reflection factors of both inputs should advantageously be equal.

The transmission antenna is preferably fashioned so that the reflection factors at the antenna inputs are likewise (advantageously automatically) adjustable. This adjustment of the reflection factors can ensue, for example, by a variation of suitable components (such as capacitors, for example) in the transmission antenna. Additional degrees of freedom in the adjustment of the field distribution thus can be achieved.

The magnetic resonance system can also have a suitable control device (for example a special activation control device) in order to adjust the terminating resistor arrangement so that a signal portion emanating at the second input of the signal splitter is reflected back to the inputs of the transmission antenna so that the radio-frequency field radiated by the transmission antenna has a predetermined field distribution.

In most application cases it is desired that the radio-frequency field be homogenized at least in a specific sub-region of the examination subject. As explained above, a homogeneously radiated radio-frequency field can be distorted by the body of the patient, for example such that a circularly polarized field can be distorted by a patient/test subject into an elliptical field. This effect occurs more strongly the greater the body mass of the patient/test subject. This can be counteracted by radiating a corresponding, oppositely pre-distorted elliptical field by the antenna so that in total a circularly polarized, homogeneous field results again.

In the specific, individual case, the question is therefore how to adjust the reflection factor in order to achieve a specific field distribution. The adjustment of the reflection factor advantageously ensues on the basis of current examination signal data. For example, data about the patient (in particular about his or her body stature, etc) as well as data about the region to be examined, and thus the specifications of the region of the scanner a particularly homogeneous radio-frequency field has to be present, are among these examination situation data. The adjustment can advantageously ensue automatically.

For example, in a particularly simple case, different examination situation classes can be predetermined and the current examination signal is associated with one of these classes on the basis of the examination signal data. Specific reflection factors are then stored in a measurement protocol for each of these examination signal classes, such that the correct reflection factor is automatically set by the magnetic resonance system, i.e., the control device thereof.

Alternatively, the reflection factor can be individually, precisely calculated or determined using simulations for the respective examination situation. In a preferred variant it is likewise possible to determine the optimal reflection factor based on measurement results of preceding magnetic resonance measurements, for example on the basis of adjustment measurements, previous examinations of the same patient or, respectively, examination subject, test measurements on phantoms or patients or, respectively, test subjects with similar body structure.

BRIEF DESCRIPTION OF THE DRAWINGS

FIG. 4 shows a terminating resistor arrangement according to a first exemplary embodiment for a radio-frequency transmission system according to FIG. 3.

FIG. 5 shows a terminating resistor arrangement according to a second exemplary embodiment for a radio-frequency transmission system according to FIG. 3.

FIG. 6 is a basic block diagram of a magnetic resonance system with the inventive exemplary embodiment of a radio-frequency transmission system according to FIG. 3.

DESCRIPTION OF THE PREFERRED EMBODIMENTS

Figure 1:
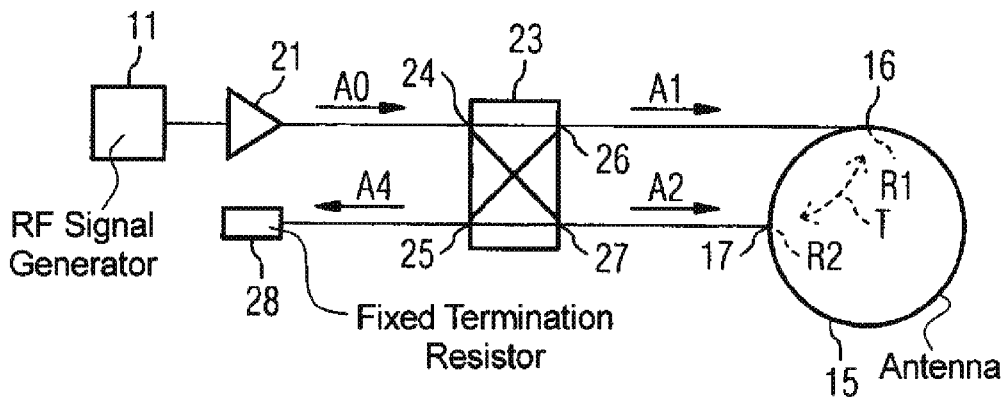
FIG. 1 is a basic block diagram of a radio-frequency transmission system connected to a transmission antenna according to the prior art, with only one transmission channel.

The conventional control (presented in FIG. 1) of a 2-port antenna by means of a radio-frequency signal generator 11 and a radio-frequency amplifier 21 whose power is divided in a signal splitter or hybrid 23 to the two channels at the inputs 16, 17 of the antenna 15 was already explained briefly above. In the following, this design is used as a starting point for consideration of the radio-frequency signals respectively present at the inputs 16, 17 of the antenna 15 in the transmission channels. The consideration ensues in the form of wave frequencies A, wherein it applies that the transmission power P is proportional to the square of the wave frequency, i.e. $P \approx A^2$. A more precise explanation of calculations with such wave frequencies is found in "Taschenbuch der Hochfrequenztechnik" by Meinke and Gundlach, Ed. K. Lange and K.-H. Löcherer, Springer Verlag, 1992, Vol. 1, 5th Edition, Chapter 2, pages C9 through C10, for example.

For the waves A1, A2 emanating from the two outputs 26, 27 of the hybrid 23 to the antenna inputs 16, 17:

$$A1 = \frac{1}{\sqrt{2}} \cdot A0 \tag{1a}$$

$$A1 = \frac{1}{\sqrt{2}} \cdot j \cdot A0 \tag{1b}$$

A0 represents the wave coming from the radio-frequency amplifier 21.

$$\frac{A2}{A1} = j \tag{1c}$$

follows from this for the ratio of the signals.

The dependency of the emanating waves A1, A2 at the outputs 26, 27 of the hybrid 23 on the wave A0 emitted by the radio-frequency amplifier 21 and arriving at the input 24 of the hybrid is due to the fact that the power is symmetrically distributed to both outputs 26, 27. The imaginary factor j results in that the signal at the second input 17 of the antenna is phase-shifted by 90° relative to the first input 16.

At this point it is noted that the hybrid 23 employed here is a symmetrical module, meaning that the gates 26, 27 used as outputs 26, 27 can also serve as inputs, and a signal entering at one of these gates 26, 27 is divided between the two gates 24, 25 used as inputs in FIG. 1.

As already explained, the antenna 15 always exhibits at its inputs a specific residual reflection which can be described by the reflection factors R1, R2. Moreover, it is nearly unavoidable that slight overcouplings between the inputs 16, 17 of the antenna 15 occur, which can be described by the transmission factor T. Normally, it is attempted to optimize the antenna so that the reflection factors R1, R2 and the transmission factor T are optimally small (i.e. near zero). However, in reality this is often not possible since these factors also dependent on the load of the antenna, among other things.

The back-coupled signal portions (which are not shown here) lead via the hybrid 23 to the situation a signal A4 also emanates at the fourth gate 25, i.e. the unused second input 25 of the hybrid 23. For this reason, the fourth gate is typically terminated with a suitable, fixed terminating resistor 28 which optimally possesses a reflection factor of zero so that no transmission power whatsoever returns back from there. A 50 Ω resistor is used in the previous typical systems. In the simplest case, it is an ohmic resistor between inner conductor and outer conductor. Insofar as an impedance of 50 Ω should be guaranteed over a large frequency range, this terminating resistance can also be realized via multiple small resistors and/or capacitors and/or inductive elements.

Figure 2:
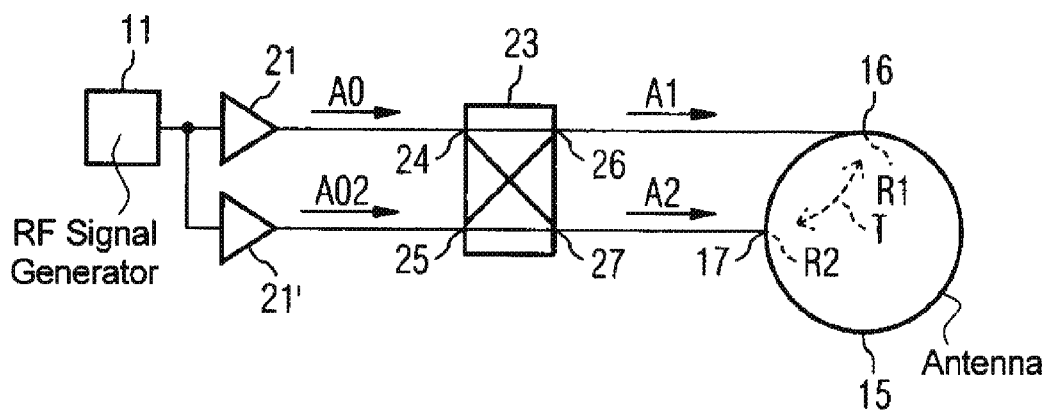
FIG. 2 is a basic block diagram of a radio-frequency transmission system connected to a transmission antenna according to the prior art, with two transmission channels.

FIG. 2 shows the variants likewise already known from the prior art, in which a separate radio-frequency amplifier 21' is also connected at the fourth gate 25 (i.e. the second input 25) of the hybrid 23. The gates 16, 17 of the antenna can be virtually "freely" activated with two such radio-frequency amplifiers 21, 21', with the goal of achieve an optimally homogeneous field distribution within a specific examination region in the patient or test subject.

If it is now assumed that the same signal should be present at both inputs 24, 25 at the hybrid 23, however with different amplification, then for the signals emanating at the amplifiers 21, 21' it applies that $$A01 = A0 \tag{2a}$$

$$A02 = k \cdot A01 = k \cdot A0 \tag{2a}$$

wherein k is thereby a freely adjustable factor $\leq 1$ which indicates the amplification due to the second radio-frequency amplifier 21' in relation to the amplification due to the first radio-frequency amplifier 21.

For the signals emanating at the outputs 26, 27 of the hybrid 23 and arriving a the antenna ports 16, 17:

$$A1 = \frac{A0}{\sqrt{2}} \cdot (1 + j \cdot k) \tag{3a}$$

$$A2 = \frac{A0}{\sqrt{2}} \cdot j \cdot (1 - j \cdot k) \tag{3b}$$

For the ratio of the wave numbers A1, A2, it then follows that $$\frac{A2}{A1} = j \cdot \frac{1 - j \cdot k}{1 + j \cdot k} \tag{3c}$$

Figure 3:
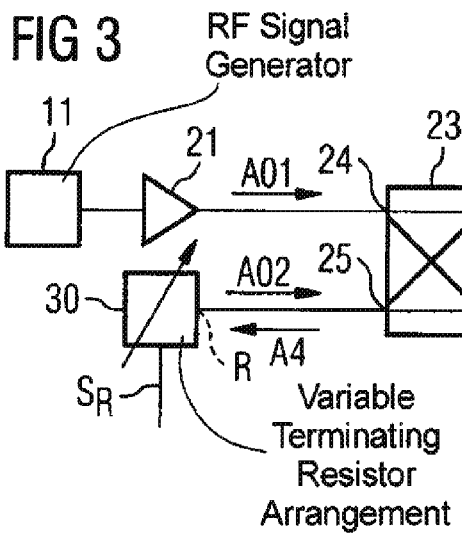
FIG. 3 is a basic block diagram of a radio-frequency transmission system with a radio-frequency transmission system according to an exemplary embodiment of the invention.

In comparison to this, FIG. 3 shows a radio-frequency transmission system 20 according to the invention in which the second radio-frequency amplifier 21' is foregone and, instead, a variable terminating resistor arrangement 30 is connected at the fourth gate 25 of the hybrid 23, the reflection factor R of which is adjustable via a control signal $S_R$. It can be shown that, analogous to Equations (3a) and (3b), for the waves A1, A2 running to the ports 16, 17 of the antenna 15:

$$A1 = \frac{A0}{\sqrt{2}} \cdot \frac{-1 + 2 \cdot R \cdot R1 + 2 \cdot j \cdot R \cdot T}{-1 + R(R1 - R2) + 2 \cdot j \cdot R \cdot T} \tag{4a}$$

$$A2 = \frac{A0}{\sqrt{2}} \cdot \frac{-(j + 2 \cdot R \cdot T + 2 \cdot j \cdot R \cdot R2)}{-1 + R(R1 - R2) + 2 \cdot j \cdot R \cdot T} \tag{4a}$$

wherein R1 and R2 are again the reflection factors at the inputs 16, 17 of the antenna 15 and T is the coupling factor between the antenna inputs 16, 17.

For the special case that an optimally good decoupling of the antennas is achieved, i.e. that T=0, for the ratio of the two wave numbers it results that:

$$\frac{A1}{A1} = \frac{1 + 2 \cdot R \cdot R2}{1 - 2 \cdot R \cdot R1} \quad (4c)$$

By a comparison (4c) with equation (3c) it can be seen that, with the use of the variable terminating resistor arrangement, ultimately the same weighting A2/A1 can be set with an adjustable reflection factor R as given use of two radio-frequency amplifiers. It is hereby to be taken into account that the reflection factor R of the terminating resistor arrangement can also be complex and negative. The single condition is that the reflection factors R1 and R2 at the antenna inputs 16, 17 are approximately equal and not equal to zero.

In order to amplify the effect, it can be heeded that the reflection factors R1, R2 at the antenna inputs 16, 17 are specifically increased, which is different than in conventional systems. However, the overcoupling factor T should optimally lie close to zero, as before.

FIG. 4 shows a particularly simple variant of a terminating resistor arrangement 30' continuously variable over a specific range, as it can be used in the radio-frequency transmission system 20 according to FIG. 3, for example. This terminating resistor arrangement 30' includes a variable phase shifter 31 that can be realized very simply via a length-variable conductor. This phase shifter 31 is attached at the side of the fourth gate 25 of the hybrid, and the other end of the phase shifter 31 is simply provided with a short 32.

For the impedance $Z_i$ of such a terminating resistor arrangement 30' formed by a short and a length-variable conductor, the following applies:

$$Z_{in} = j \cdot Z_1 \cdot \tan\left(2\pi \cdot \frac{l}{\lambda}\right) \quad (5)$$

wherein l is thereby the length of the conductor, $Z_1$ is the impedance of the conductor and $\lambda$ is the wavelength of the radio-frequency signals. Given a typical frequency of 120 MHz to excite the nuclear spins of water protons, the wavelength in air is approximately 2.5 m. Equation (5) shows that the impedance $Z_{in}$ of the entire terminating resistor arrangement 30' can vary due to variation of the length l over a wide range, wherein both inductive and capacitive terminating resistors can be realized, and thus arbitrary reflection factors R can be set. For example, for l<λ/4 the total impedance $Z_{in}$, is inductive. Given a length l=λ/4 of the conductor, the terminating resistance is open, such that a reflection factor R=1 results. A capacitive impedance $Z_{in}$ exists for a range λ/4<l<λ/2. Given a conductor length l=λ/2, a short exists which likewise has a high reflection, namely a reflection factor R=−1.

FIG. 5 shows an additional variant of a suitable terminating resistor arrangement 30". This has a change-over switch 38 whose input is connected with the fourth gate 25 of the hybrid. Three outputs which can be switched to from the input of the change-over switch 38 by means of a switching signal $S_R$' are respectively provided with different terminating resistors 36, 37 or the terminating resistor module 35. A first terminating resistor module 35 corresponds to the terminating resistor arrangement 30' according to FIG. 4 and allows a variable adjustment of the terminating resistance or of the reflection factor in a specific range. The additional terminating resistances 36, 37 are fixed terminating resistors, for example a resistor 26 with the typical 50 Ω and a complex impedance 37 which can be designed from multiple resistors, coils, capacitors etc. It is clear that an arbitrary number of terminating resistors can be selected via such a change-over switch 38 insofar as the change-over switch 38 has correspondingly many switching outputs. In particular, it is also possible to couple variable resistors or, respectively, resistor arrangements that are adjustable in different ranges at each of the outputs in order to achieve arbitrary reflection factors over a very large frequency range, for example.

FIG. 6 shows a principle block diagram for an exemplary embodiment of a magnetic resonance system 1 with a correspondingly designed radio-frequency transmission device 20.

The core of this magnetic resonance system 1 is an MR scanner 13 in which a patient P is positioned on a bed 18 in a cylindrical examination space 14. A transmission antenna 15 annularly surrounding the examination space 14 is located inside the scanner 13 to emit radio-frequency pulses. For example, this can be a generally known scanner 13 which itself must satisfy no particular additional requirements for the method according to the invention.

The scanner 13 is controlled by a system controller 2. A terminal 3 (or, respectively, control console) via which an operator operates the system controller 2 (and therefore the scanner 13) is connected via a terminal interface 4. The system controller 2 is connected via a tomograph control interface 7 and an image acquisition interface 8 with the scanner 13. The corresponding control commands are output via the tomograph control interface 7 to the scanner 13 and the radio-frequency transmission system 20 according to the invention so that the desired pulse sequences (i.e. the radio-frequency pulses and the gradient pulses) are emitted. Raw data RD (i.e. the acquired signals) are read out via the image data acquisition interface 8.

A central component in the system controller 2 is a processor 5 in which various control components are realized in the form of software. At this point it is noted that such a system controller 2 can naturally also be formed by a number of processors networked with one another, in which processors the various control components are realized in the form of program modules, for example.

Such a component is a measurement control unit 9 with which the operator can communicate via the terminal 3. This measurement control unit 9 controls the scanner 13 via the scanner interface 7 and thus provides the emission of the desired radio-frequency pulse sequences via the transmission antenna 15 and furthermore that the gradients are switched in a suitable manner in order to implement the desired measurements. The measurement control unit 9 receives the specifications for the emission of the radio-frequency pulse sequences and of the gradient pulse sequences in a typical manner in the form of measurement protocols that, for example, are stored in a memory 6 and can be altered by the operator.

The raw data RD acquired via the image acquisition interface 8 are conducted to an additional component (an image reconstruction unit 10) realized at the processor 5, which image reconstruction unit 10 correspondingly processes the raw data RD. The image reconstruction unit 10 provides for a Fourier transformation of the raw data RD and for a reconstruction of images. The generated image data can, for example, be stored in the memory 9 of the system controller 13 and/or be output on the screen of the terminal 3 for the operator.

Both the system controller 2 and the terminal 3 can also be integral components of the scanner 2. The entire magnetic resonance system 1, moreover, has all additional, typical components and features such as, for ex ample, interfaces for connection to a communication network, which is connected (for example) with an image information system (PACS, Picture Archiving and Communication System) or offers connection possibilities for external data stores. However, these components are not all shown in FIG. 6 for better clarity.

The magnetic resonance system according to the invention here has, as an additional component according to the invention, a special radio-frequency transmission system 20 as shown in FIG. 3. The radio-frequency signal for emission via the transmission antenna 15 is normally generated at a radio-frequency signal generator 11 (which here is shown as part of the scanner interface 7, but can also be a separate part). As already mentioned, the specifications for this are provided by the measurement control unit 9 on the basis of measurement protocols. These radio-frequency signals (which are also designated as "small signals" since they exhibit relatively small amplitudes) are then amplified in the radio-frequency amplifier 21. This can likewise be controlled by the scanner interface 7, at least insofar as that the amplification is provided by the scanner interface 7. The output signal then arrives at a hybrid 23 and is sent to two transmission channels at the parts 16, 17 of the transmission antenna 15. According to the invention (as shown as well in FIG. 3), an adjustable terminating resistor arrangement 30 is connected at the fourth gate of this hybrid 23. This receives a control signal $S_R$ from a special control unit 12 (which likewise can be part of the scanner interface 7), such that the matching reflection factor R is set for the respective measurement and precisely the desired field distribution is achieved in the examination space 14.

The third arrow leading from the scanner interface 7 to the scanner 13 merely symbolizes the additional control commands for the control of the bed 18, the gradient coils, etc.

Overall, an arbitrary radio-frequency distribution can thus be set via the measurement control unit 9 with the aid of the control of the radio-frequency amplifier 21 and the control of the adjustable terminating resistor arrangement 30, wherein the radio-frequency distribution is reasonably adjusted so that it is optimally homogeneous.

Since the field distortion which is caused by the patient P in the examination space 14 is, among other things, strongly dependent on the figure of the patient, but also can be dependent on other parameters of the respective examination situation, an adjustment measurement can respectively be implemented for this. However, a distinct improvement of the $B_1$ field distribution in the examination subject is also already achieved when pre-determined parameter sets are respectively established for specific classes of examination sits, i.e. for types of examinations with specific types of patients, for example. For example, these can be predetermined in the measurement protocols or, respectively, the operator can also modify the measurement protocols with regard to these parameters via corresponding inputs at the terminal. A measurement can then be implemented with the matching parameters.

Although modifications and changes may be suggested by those skilled in the art, it is the intention of the inventors to embody within the patent warranted hereon all changes and modifications as reasonably and properly come within the scope of their contribution to the art.

We claim as our invention:

1. A radio-frequency transmission system for a magnetic resonance system, comprising:
   a radio-frequency amplifier having an amplifier output;
   a signal splitter having two inputs and two outputs, said signal splitter causing power of a radio-frequency signal at one of said two inputs to be divided between said two outputs;
   a first input of said two inputs of said signal splitter being coupled with the amplifier output, and the two outputs of the signal splitter being configured for connection to respectively different inputs of a transmission antenna of the magnetic resonance system to feed output signals from said two outputs in the transmission antenna; and
   a second input of said two inputs of said signal splitter being terminated with a terminating resistor arrangement having a variable reflection factor.

2. A radio-frequency transmission system as claimed in claim 1 wherein said terminating resistor arrangement comprises a plurality of different terminating resistors and a change-over switch allowing any of said different terminating resistors to be selectively connected to the second input.

3. A radio-frequency transmission system as claimed in claim 1 wherein said reflection factor of said terminating resistor arrangement is continuously variable at least within a predetermined adjustment range.

4. A radio-frequency transmission system as claimed in claim 1 wherein said terminating resistor arrangement is an adjustable phase shifter.

5. A radio-frequency transmission system as claimed in claim 4 wherein said adjustable phase shifter is continuously variable in phase at least within a predetermined adjustment range.

6. A radio-frequency transmission system as claimed in claim 1 wherein said signal splitter is configured to give the respective output signals at the two outputs of the signal splitter a defined phase difference relative to each other.

7. A magnetic resonance tomography system comprising:
   a magnetic resonance scanner configured to interact with a subject to acquire magnetic resonance data therefrom;
   a transmission antenna associated with said scanner that radiates radio-frequency signals into the examination subject in the scanner, said transmission antenna having two inputs for infeed of radio-frequency signals thereto; and
   a radio-frequency transmission system comprising a radio-frequency amplifier having an amplifier output, a signal splitter having two inputs and two outputs, said signal splitter causing power of a radio-frequency signal at one of said two inputs to be divided between said two outputs, a first input of said two inputs of said signal splitter being coupled with the amplifier output, and the two outputs of the signal splitter being configured for connection to said respective inputs of said transmission antenna to feed output signals from said two outputs in the transmission antenna, and a second input of said two inputs of said signal splitter being terminated with a terminating resistor arrangement having a variable reflection factor.

8. A magnetic resonance system as claimed in claim 7 wherein said transmission antenna is configured to allow respective reflection factors at the respective inputs thereof to be adjustable.

9. A magnetic resonance system as claimed in claim 7 comprising a control unit connected to said terminating resistor arrangement that adjusts said terminating resistor arrangement to cause a signal portion at the second output of the signal splitter to be reflected back by the terminating resistor arrangement to the inputs of the transmission antenna, to give a radio-frequency field radiated by the transmission antenna a predetermined field distribution.

10. A method for controlling a magnetic resonance imaging system to acquire magnetic resonance data from an examination subject, comprising the steps of:
   emitting radio-frequency signals from a radio-frequency amplifier with a predetermined signal power to generate a radio-frequency field in an examination volume;
   supplying said radio-frequency signals to one of two inputs of a signal splitter and, in said signal splitter, dividing said power of said signal at said one input between two output signals respectively at two outputs of the signal splitter;
   coupling the two outputs of the signal splitter respectively to two inputs of a transmission antenna and radiating said radio-frequency field from said transmission antenna; and
   terminating a second of the two inputs of the signal splitter with a terminating resistor arrangement that has a variable reflection factor, and adjusting said reflection factor to cause a signal portion at said second input of the signal splitter is reflected back, at least in significant part, by said terminating resistor arrangement to the inputs of the transmission antenna to cause said radio-frequency field radiated by the transmission antenna to cause said transmission antenna to generate said radio-frequency field conforming to a predetermined field distribution.

11. A method as claimed in claim 10 comprising adjusting said reflection factor to homogenize said radio-frequency field at least in a predetermined region of an examination subject.

12. A method as claimed in claim 10 comprising adjusting said reflection factor dependent on examination situation data associated with examination of a current subject under current conditions.

13. A method as claimed in claim 12 comprising adjusting said reflection factor dependent on measurement results of a preceding magnetic resonance measurement.

14. A method as claimed in claim 10 comprising adjusting components of said transmission antenna to cause at least one predetermined minimum portion of the radio-frequency signal transmitted to the transmission antenna to be reflected at the antenna inputs.

* * * * *